United States Patent [19]
Balicki et al.

[11] Patent Number: 5,953,537
[45] Date of Patent: Sep. 14, 1999

[54] METHOD AND APPARATUS FOR REDUCING THE NUMBER OF PROGRAMMABLE ARCHITECTURE ELEMENTS REQUIRED FOR IMPLEMENTING A LOOK-UP TABLE IN A PROGRAMMABLE LOGIC DEVICE

[75] Inventors: Janusz K. Balicki, San Jose; Bezhad Nouban, Fremont; Khusrow Kiani, Oakland, all of Calif.

[73] Assignee: Altera Corporation, San Jose, Calif.

[21] Appl. No.: 08/259,360

[22] Filed: Jun. 14, 1994

Related U.S. Application Data

[63] Continuation of application No. 08/017,096, Feb. 12, 1993, abandoned.

[51] Int. Cl.⁶ .................................................. H03K 19/00
[52] U.S. Cl. ........................................ 395/800.01; 326/39
[58] Field of Search ............................ 395/800; 307/465, 307/468

[56] References Cited

U.S. PATENT DOCUMENTS

| | | | |
|---|---|---|---|
| 3,702,393 | 11/1972 | Fuss | 364/726 |
| 4,152,778 | 5/1979 | Nissen et al. | 365/94 |
| 4,617,479 | 10/1986 | Hartmann | 395/800 |
| 4,967,107 | 10/1990 | Kaplinsky | 307/465 |
| 4,972,105 | 11/1990 | Burton et al. | 307/468 |
| 5,241,224 | 8/1993 | Pedersen et al. | 307/465 |

OTHER PUBLICATIONS

Altera Corporation 1992 Data Book, pp. 1–34.

*Primary Examiner*—Meng-Ai T. An
*Assistant Examiner*—Walter D. Davis, Jr.
*Attorney, Agent, or Firm*—Townsend and Townsend and Crew LLP

[57] ABSTRACT

A method and apparatus for reducing the number of programmable architecture elements required for implementing a look-up table in a programmable logic device. At least one logic function to be performed by the look-up table is chosen. An output state is determined for each set of inputs to the look-up table, the output state being an array of outputs of the look-up table. Each output state is made up of responses of the chosen logic functions to a particular set of input variables. Identical output states are formed into groups. Selected groups of the output states which do not require programmable architecture elements are eliminated. A programmable architecture element is then assigned for each remaining group of output states.

13 Claims, 2 Drawing Sheets

| INPUTS | | | | OUTPUTS | | |
|---|---|---|---|---|---|---|
| J | K | L | M | AND | OR | XOR |
| 0 | 0 | 0 | 0 | 0 | 0 | 0 |
| 0 | 0 | 0 | 1 | 0 | 1 | 1 |
| 0 | 0 | 1 | 0 | 0 | 1 | 1 |
| 0 | 0 | 1 | 1 | 0 | 1 | 0 |
| 0 | 1 | 0 | 0 | 0 | 1 | 1 |
| 0 | 1 | 0 | 1 | 0 | 1 | 0 |
| 0 | 1 | 1 | 0 | 0 | 1 | 0 |
| 0 | 1 | 1 | 1 | 0 | 1 | 1 |
| 1 | 0 | 0 | 0 | 0 | 1 | 1 |
| 1 | 0 | 0 | 1 | 0 | 1 | 0 |
| 1 | 0 | 1 | 0 | 0 | 1 | 0 |
| 1 | 0 | 1 | 1 | 0 | 1 | 1 |
| 1 | 1 | 0 | 0 | 0 | 1 | 0 |
| 1 | 1 | 0 | 1 | 0 | 1 | 1 |
| 1 | 1 | 1 | 0 | 0 | 1 | 1 |
| 1 | 1 | 1 | 1 | 1 | 1 | 0 |

# METHOD AND APPARATUS FOR REDUCING THE NUMBER OF PROGRAMMABLE ARCHITECTURE ELEMENTS REQUIRED FOR IMPLEMENTING A LOOK-UP TABLE IN A PROGRAMMABLE LOGIC DEVICE

This is a Continuation of application Ser. No. 08/017,096, filed Feb. 12, 1993, now abandoned.

BACKGROUND OF THE INVENTION

This invention relates to a look-up table architecture. In particular, it relates to a technique for reducing the number of programmable architecture elements, such as SRAM cells, required, yet implements a look-up table which is capable of performing a limited number of specific multi-variable logic functions.

Look-up tables are highly configurable combinatorial logic devices. Their programming flexibility makes them desirable for use as basic building blocks in programmable logic devices (PLDs). Generally, a look-up table employs an array of programmable architecture elements, such as SRAM cells, to store data bits which are effectively used as output signals, each of the data bits corresponding to a particular set of input signals. A particular data bit is gated to the look-up table output terminal by means of logic gates which are controlled by the input signals (and their complements) to the look-up table. FIG. 1 is an illustration of the implementation of a generic 4-input look-up table.

The look-up table is controlled by 16 programmable SRAM cells 44, although any other type of memory device may be used. The output signal of each of these SRAM cells is applied to a respective one of 16 AND gates 80. Alternate ones of AND gates 80 are respectively controlled by the true and complement of the first data input J, the complement of input J being produced by inverter I1. The outputs of adjacent pairs of AND gates 80 are then combined by OR gates 81 and applied to eight AND gates 82. Alternate ones of AND gates 82 are respectively controlled by the true and complement of the second data input K, the complement of input K being produced by inverter I2. The outputs of adjacent pairs of AND gates 82 are combined by OR gates 83 and then applied to four AND gates 84. Alternate ones of AND gates 84 are respectively controlled by the true and complement of the third data input L, the complement of input L being produced by inverter I3. The outputs of adjacent pairs of AND gates 84 are combined by OR gates 85 and applied to two AND gates 86. One of AND gates 86 is controlled by the true of the fourth data input M, while the other AND gate 86 is controlled by the complement of that input, the complement of input M being produced by inverter I4. The outputs of AND gates 86 are combined by OR gate 87 to produce the data output. It will be apparent from the foregoing that any desired logical combination of data inputs J–M will produce a desired output from the SRAM cells 44.

The number of SRAM cells usually required to implement a look-up table depends upon the number of inputs to the look-up table. For a look-up table with n inputs, $2^n$ SRAM cells are required to ensure that any function of n variables may be provided. It is often the case, however, that programmers of a particular PLD architecture use many of the look-up tables to perform a limited number of logic functions. For example, it is often the case that when a particular PLD is programmed, many of the look-up tables perform one of only three 4-variable functions—AND, OR, and XOR. In such a case, regardless of which of the three functions an individual programmer ultimately uses, some of the data bits stored in the 16 ($2^4$) SRAM cells dedicated for the 4-input look-up table will be redundant across the entire range of possible outputs. As a result, SRAM cells, and therefore die space on the PLD, will be inefficiently used.

Thus, there is a need for a look-up table architecture and a technique which reduces the number of programmable architecture elements required to implement certain limited function look-up tables.

SUMMARY OF THE INVENTION

In accordance with the invention, look-up tables are provided which perform only a limited number of specific logic functions. These look-up tables are designed with fewer programmable architecture elements (i.e., SRAM cells) than look-up tables which allow any desired logic function, the number of elements required in those cases depending only on the number of input connections.

To implement this system, the designer of the programmable logic device must decide what logic functions the look-up table should be able to perform. Then truth tables corresponding to each function must be developed. The range of outputs for a given input across all of the desired logic functions is referred to herein as an "output state". Because the number of logic functions is limited, it is likely that many of the output states will be identical. The designer must then group all identical output states together, eliminating any output states which will not require a programmable architecture element. For example, the result always "0" does not require a programmable element, but may instead be hardwired to a logic "0" level. The designer then determines the number of programmable architecture elements required for the implementation of the custom look-up table, that number being equal to the number of different output states.

Thus, the invention comprises a method for reducing the number of programmable architecture elements required for implementing a look-up table having a plurality of inputs. The method is implemented by choosing at least one logic function to be performed by the look-up table and determining an output state for each input state to the look-up table. Each output state comprises an array of outputs of the look-up table which are the responses of the chosen logic functions to the input states. This is followed by the formation of groups of output states which are identical, and eliminating any output states not requiring a programmable architecture element. The method is completed by assigning one programmable architecture element for each group of output states.

The resulting look-up table resembles a traditional look-up table, as described above, except that the number of programmable architecture elements is reduced in accordance with the technique described above. Specific embodiments described below will serve to more clearly illustrate the invention.

DESCRIPTION OF THE SPECIFIC EMBODIMENTS

The following is a description of the design and implementation of a 4-input custom look-up table with a reduced number of programmable architecture elements capable of performing AND, OR, and XOR logic functions. This method may be generalized to design and implement any simplified set of logic functions.

Figures 1, 2:
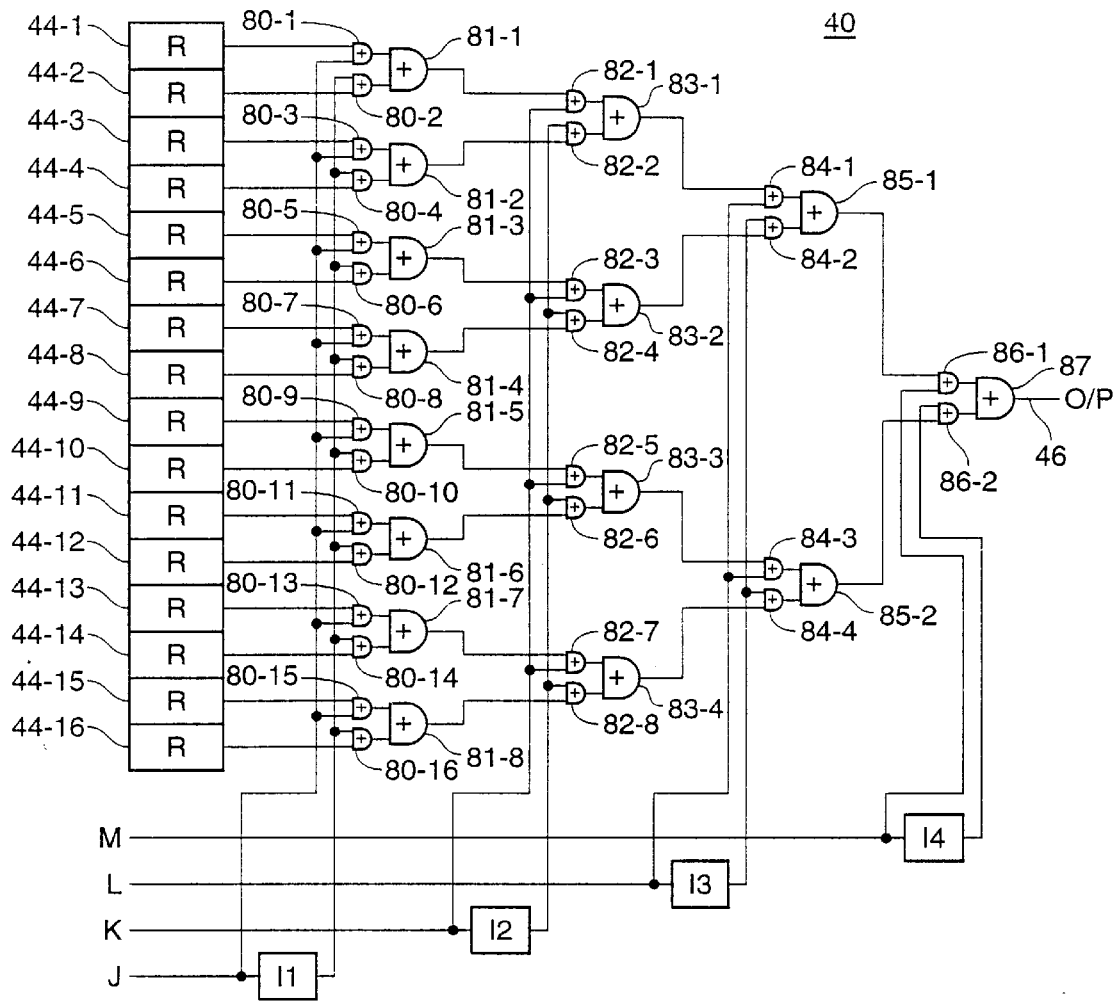
FIG. 1 is an illustration of the implementation of a generic 4-input look-up table.
FIG. 2 is a logic truth table showing the output states for a 4-input look-up table capable of performing AND, OR, and XOR logic functions.

FIG. 2 is a logic truth table showing the output states for a 4-input look-up table capable of performing three different desired functions—AND, OR, and XOR. The columns designated J, K, L, and M show the possible states of the input terminals for a four input look-up table. The columns designated AND, OR, and XOR show the possible states of the output terminal for these three Boolean functions. For example, for the conditions J=0, K=1, L=1, and M=1, the output will be "0" for an AND function, "1" for an OR function, and "1" for an exclusive OR function (XOR).

Upon examination of FIG. 2, it is immediately apparent that there are only four distinct output states, namely "000", "011", "010", and "110". Therefore, only 4 SRAM cells are required to implement this particular custom look-up table. Furthermore, if the result "000" is considered trivial, then the number of SRAM cells required may be further reduced to three. In either case it is not difficult to appreciate the advantage of reducing the number of SRAM cells in this instance by at least 75%.

It should also be noted that with these three logic functions, AND, OR, and XOR, the number of output states is independent of the number of inputs. That is, no matter how many input variables are involved, there will only be four output states associated with a custom look-up table which is limited to AND, OR, and XOR functions (i.e., "000", "011", "010", and "110" or "111"). This result means that as the number of inputs to a look-up table increases, the potential savings in terms of SRAM cells also increases.

Figure 3:
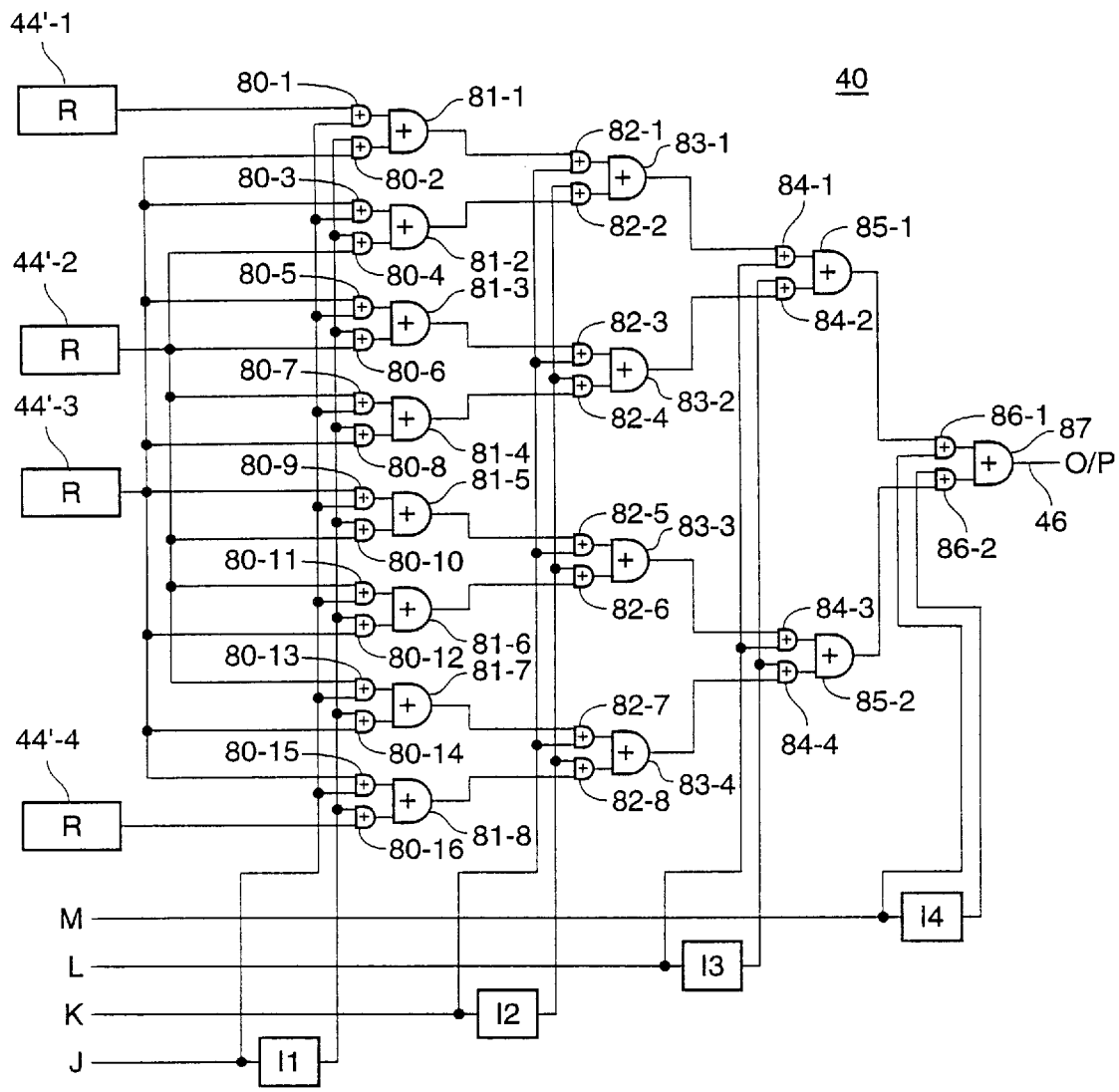
FIG. 3 is an illustration of the implementation of the 4-input look-up table, the function of which is described by the logic truth table of FIG. 2.

FIG. 3 is an illustration of the implementation of the above described 4-input custom look-up table. This particular implementation employs much of the same logic circuitry as the prior art look-up table depicted in FIG. 1. However, the number of SRAM cells 44' is dramatically reduced by the technique described above. The SRAM cells 44' representing particular output states are connected to multiple AND gates 80, the connections being to those AND gates which would have been connected to SRAM cells 44 in FIG. 1 corresponding to the same output states.

For example, the data bit stored in SRAM cell 44'-2 will be gated to the look-up table output terminal by the following input states: "0011", "0101", "0110", "1001", "1010", and "1100". Thus, the output state "010", which corresponds to these input states, has been assigned to SRAM cell 44'-2.

It should be noted that although the programmable architecture elements in the above descriptions have been referred to as SRAM cells, any other type of memory device, such as electrically-erasable programmable read-only-memories (EEPROMs), may be used to implement the invention described herein.

While the invention has been particularly shown and described with reference to specific embodiments thereof, it will be understood by those skilled in the art that the foregoing and other changes in the form and details may be made therein without departing from the spirit or scope of the invention. Consequently, the scope of the invention should be determined solely with respect to the following claims.

What is claimed is:

1. A method for designing a limited function look-up table having a reduced number of programmable architecture elements, the look-up table having a plurality of inputs, the method comprising:

choosing a plurality of logic functions to be performed by the look-up table;

determining an output state for each set of input variables, each output state comprising an array of responses of the plurality of logic functions to a particular set of input variables;

forming groups of the output states, the groups of output states comprising identical output states;

eliminating selected groups of the output states, the selected groups not requiring programmable architecture elements; and assigning a programmable architecture element for each remaining group of output states, each programmable architecture element being for storing the responses of a particular output state.

2. A method as described in claim 1 wherein the programmable architecture elements comprise memory cells.

3. A method as described in claim 1 wherein the programmable architecture elements comprise static random-access-memory cells.

4. A method as described in claim 1 wherein the logic functions comprise AND, OR and XOR.

5. A look-up table architecture for performing a limited number of specific logic functions with a first number of input variables, said look-up table architecture comprising:

a look-up table output terminal;

a second number of programmable architecture elements, the programmable architecture elements for storing outputs, the outputs being organized into output states, each output state comprising responses of the specific logic functions to a particular set of input variables, the second number being less than a third number of programmable architecture elements required for implementing a look-up table architecture capable of performing all possible logic functions of the first number of variables, each programmable architecture element being for storing the outputs of a particular output state;

a plurality of logic gates coupled to the programmable architecture elements and the look-up table output terminal, the logic gates for gating the outputs stored in the programmable architecture elements to the look-up table output terminal; and a plurality of input terminals connected to the logic gates, signals being supplied to the input terminals, the signals defining an input state to control the plurality of logic gates, thereby facilitating the gating of an output stored in a particular programmable architecture element to the output terminal.

6. A look-up table architecture as described in claim 5 further comprising a plurality of inverters, the inverters for generating complements of the input states, the complements for controlling the logic gates.

7. A look-up table architecture as described in claim 5 wherein the programmable architecture elements comprise memory cells.

8. A look-up table architecture as described in claim 5 wherein the programmable architecture elements comprise static random-access-memory cells.

9. A look-up table architecture for performing AND, OR, and XOR logic functions, the look-up table architecture comprising:

a look-up table output terminal;

no more than four programmable architecture elements, the programmable architecture elements for storing outputs, the outputs being organized into output states, each output state comprising responses of the AND, OR, and XOR logic functions to a particular set of input variables, each programmable architecture element being for storing the outputs of a particular output state;

a plurality of logic gates coupled to the programmable architecture elements and the look-up table output terminal, the logic gates for gating the outputs stored in the programmable architecture elements to the look-up table output terminal; and at least three input terminals connected to the logic gates, signals being supplied to the input terminals, the signals defining an input state to control the plurality of logic gates, thereby facilitating the gating of an output stored in a particular programmable architecture element to the output terminal.

10. A look-up table architecture as described in claim 9 further comprising a plurality of inverters, the inverters for generating complements of the input states, the complements for controlling the logic gates.

11. A look-up table architecture as described in claim 9 wherein the programmable architecture elements comprise memory cells.

12. A look-up table architecture as described in claim 9 wherein the programmable architecture elements comprise static random-access-memory cells.

13. A look-up table architecture for performing AND, OR, and XOR logic functions, the look-up table architecture comprising:

a look-up table output terminal;

no more than four programmable static random-access-memory cells, the static random-access-memory cells for storing outputs, the outputs being organized into output states, each output state comprising responses of the AND, OR, and XOR logic functions to a particular set of input variables, each static random-access-memory cell being for storing the outputs of a particular output state;

a plurality of AND and OR logic gates coupled to the static random-access-memory cells and the look-up table output terminal, the logic gates for gating the outputs stored in the static random-access-memory cells to the look-up table output terminal;

at least three input terminals connected to the logic gates, signals being supplied to the input terminals, the signals defining an input state to control the plurality of logic gates, thereby facilitating the gating of an output stored in a particular static random-access-memory cell to the output terminal; and a plurality of inverters, the inverters for generating complements of the input states, the complements for controlling the logic gates.

\* \* \* \* \*